United States Patent
Takiar et al.

(10) Patent No.: US 6,398,034 B1
(45) Date of Patent: Jun. 4, 2002

(54) UNIVERSAL TAPE FOR INTEGRATED CIRCUITS

(75) Inventors: Hem P. Takiar, Fremont; Nikhil Vishwanath Kelkar, Santa Clara, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/515,588

(22) Filed: Feb. 29, 2000

(51) Int. Cl.$^7$ ............................................. B65D 85/00
(52) U.S. Cl. ...................... 206/716; 206/722; 206/486
(58) Field of Search ................... 206/713, 714, 206/716, 717, 718, 722, 723, 725, 486, 487, 493, 562

(56) References Cited

U.S. PATENT DOCUMENTS

| | | | | |
|---|---|---|---|---|
| 3,270,877 A | * | 9/1966 | Hecker | 206/713 |
| 4,099,615 A | * | 7/1978 | Lemke et al. | 206/713 |
| 4,118,859 A | * | 10/1978 | Busler | 206/714 |
| 4,583,641 A | * | 4/1986 | Gelzer | 206/714 |
| RE32,540 E | * | 11/1987 | Murphy | 206/443 |
| 4,736,841 A | * | 4/1988 | Kaneko et al. | 206/714 |
| 4,757,895 A | * | 7/1988 | Gelzer | 206/714 |
| 4,815,595 A | * | 3/1989 | Bond et al. | 206/713 |
| 4,966,281 A | * | 10/1990 | Kawanishi et al. | 206/713 |
| 5,046,610 A | * | 9/1991 | Runyon et al. | 206/713 |
| 5,168,996 A | * | 12/1992 | Johnson | 206/523 |
| 5,499,717 A | * | 3/1996 | Hayashi | 206/713 |
| 5,648,136 A | * | 7/1997 | Bird | 206/562 |
| 5,878,890 A | * | 3/1999 | Kancko | 206/714 |
| 5,908,114 A | * | 6/1999 | Althouse et al. | 206/714 |
| 5,918,746 A | * | 7/1999 | Tokita et al. | 206/716 |
| 5,967,328 A | * | 10/1999 | Ziberna | 206/714 |
| 5,975,295 A | * | 11/1999 | Diamond | 206/366 |
| 6,016,918 A | * | 1/2000 | Ziberna | 206/714 |
| 6,186,330 B1 | * | 2/2001 | Yoshimura | 206/594 |

* cited by examiner

*Primary Examiner*—Shian Luong
(74) *Attorney, Agent, or Firm*—Beyer Weaver & Thomas, LLP

(57) ABSTRACT

The present invention provides a low cost carrier tape designed to store chips during transportation. The invention comprises a carrier tape which contains receptacle holes designed to secure chips onto the carrier tape by clasping onto the chip's electrical contacts. The receptacle holes prevent the chip from rotating and physically moving. The receptacle holes are formed in patterns to match the standardized electrical contact patterns of flip chip families. The diameters of the receptacle holes may be sized slightly smaller than the diameter of electrical contacts such that a chip is secured by "snap-fitting" each electrical contact into a receptacle hole. Relief slits may be formed on the edges of the receptacle holes to facilitate the "snap-fitting" of electrical contacts into receptacle holes.

14 Claims, 8 Drawing Sheets

UNIVERSAL TAPE FOR INTEGRATED CIRCUITS

FIELD OF THE INVENTION

The present invention relates generally to semiconductor devices, and more specifically, to a universal carrier tape for transporting semiconductor devices.

BACKGROUND

Semiconductor integrated circuits (IC's) are typically fabricated in wafer form. After fabrication, the individual chips are scribed from the wafer and then undergo numerous processing and handling steps before they are tested and packaged. One type of common chip package, known as a "flip chip," is a package having electrical contacts extending outwardly from the bottom surface of the package. Flip chip packages are manufactured in many different sizes. However, flip chips can be grouped into a number of families wherein each family has electrical contacts formed in a standardized pattern.

A carrier tape and reel assembly is typically used to transport the flip chips to the individual manufacturing stations for processing and testing. The carrier tape and reel assembly includes a carrier tape having a plurality of cavities designed to hold flip chips. Generally, there is nothing in the cavity to secure the chip. As a result, the chip may rotate or physically move within the cavity. If the chip rotates, an automated machine may pick up and place the device in the wrong orientation on a test machine or on a printed circuit board. A severe physical disturbance may damage the chip, thereby causing it to be unfit for use or causing a system utilizing the chip to malfunction.

To avoid these problems, the size of the cavity is customized for each flip chip package size. This tends to be expensive, particularly for semiconductor manufacturers which produce flip chips having many different package sizes. Sometimes, semiconductor manufacturers seal the chips within the cavities using a cover tape. Utilizing the cover tape material and implementing the extra steps to attach and remove the cover tape, however, increases the cost and complexity of transporting and handling the chips. Another method of securing the flip chips is through adhering the chip to adhesive tape placed on the bottom surface of the cavity. However, the adhesive substance may cause contamination of the electrical contacts on the chip as well as increase the cost and complexity of handling the devices.

In view of the foregoing, a low cost carrier tape that securely holds and protects flip chips, but that does not require the use of either cover tape or adhesive tape would be desired.

SUMMARY

The present invention provides a low cost carrier tape designed to store chips during transportation. The invention comprises a carrier tape which contains receptacle holes designed to secure chips onto the carrier tape by clasping onto the chip's electrical contacts. The receptacle holes are formed in patterns to match the standardized electrical contact patterns of each flip chip family.

The receptacle holes prevent the flip chip from rotating and physically moving. Preventing rotation ensures proper orientation of the flip chip in the testing and manufacturing processes. Preventing physical movement reduces the chance of damage occurring to the flip chip. Preventing rotation and physical movement makes the use of cover tape or adhesive tape unnecessary. This reduces the cost and complexity of the transportation process, as well as avoids possible contamination of the electrical contacts on the flip chips. Additionally, cavity sizes do not need to be customized to chip package sizes within each family of flip chips since the receptacle hole patterns are created to match the contact patterns of specific flip chip families. This further reduces the cost of transporting flip chips. In sum, this invention provides a more cost effective, more secure and contamination-free method for transporting flip chips.

BRIEF DESCRIPTION OF THE DRAWINGS

The invention, together with further advantages thereof, may best be understood by reference to the following detailed description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1A:
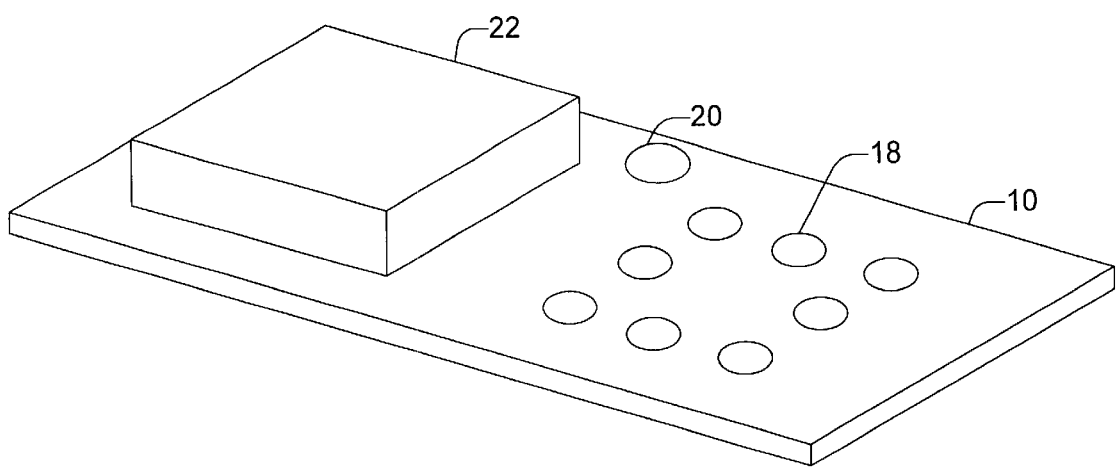
FIG. 1A is a perspective view of one embodiment of the carrier tape of the subject invention.

FIG. 1A illustrates a universal carrier tape 10 according to one embodiment of the invention. Carrier tape 10 is formed from a flexible material which may include, but is not limited to plastic or rubber. Formed on the surface of the carrier tape 10 are sets of receptacle holes 18. The receptacle holes 18 secure chips 22 to the carrier tape by receiving and clasping onto electrical contacts located on the bottom surface of the chips. In this embodiment of the invention, each receptacle hole is sufficiently sized to receive a single electrical contact. The illustrated pattern of receptacle holes has eight receptacle holes which create an outline of a square. As may be appreciated by those of ordinary skill in the art, receptacle holes 18 may be formed in a variety of patterns, shapes and sizes, one of which is shown in FIG. 1A for purposes of illustration. Also included on the surface of tape 10 are a series of index holes 20 each associated with a set of receptacle holes 18. The index holes 20 allow testing and packaging machines to guide the carrier tape 10 through chip processing steps. The distance between adjacent receptacle holes within a set is referred to as the "pitch" of the receptacle holes. It should be apparent that the invention may be used with devices having a wide variety of different pitches. By way of example, the invention works well with devices having pitches in the range of 0.4 to 1.0 mm (which are typical of the state of the art at the time of this writing). For example, pitches of approximately 1.0, 0.8, 0.75, 0.5, and 0.4 mm are common pitches in current BGA and flip chip devices.

Figure 1B:
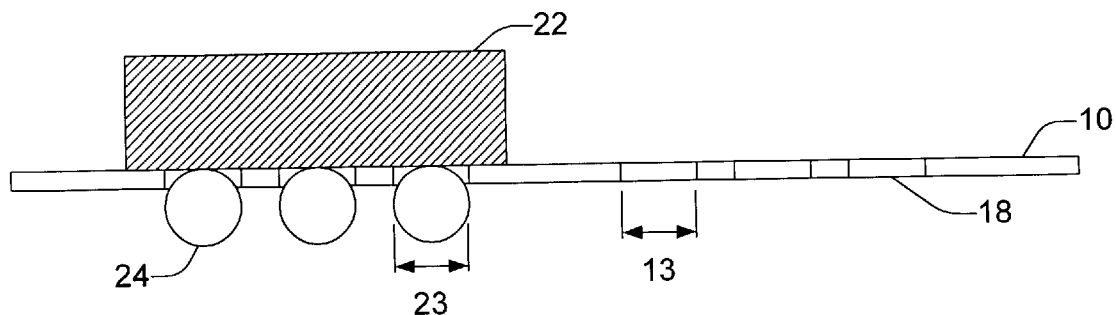
FIG. 1B is a cross-sectional view of the carrier tape of FIG. 1A.

FIG. 1B illustrates the cross-sectional view of the carrier 10 of FIG. 1A with a chip 22 attached to the carrier tape. Chip 22 takes the form of a packaged integrated circuit having electrical contacts 24 formed on the bottom surface thereof. In the embodiment shown, the electrical contacts 24 are balls. The lower portion of the balls have a somewhat spherical shape and thereby have an upper constricted portion (adjacent the package) that has a width less than a maximum diameter 23 of the ball.

Figure 1C:
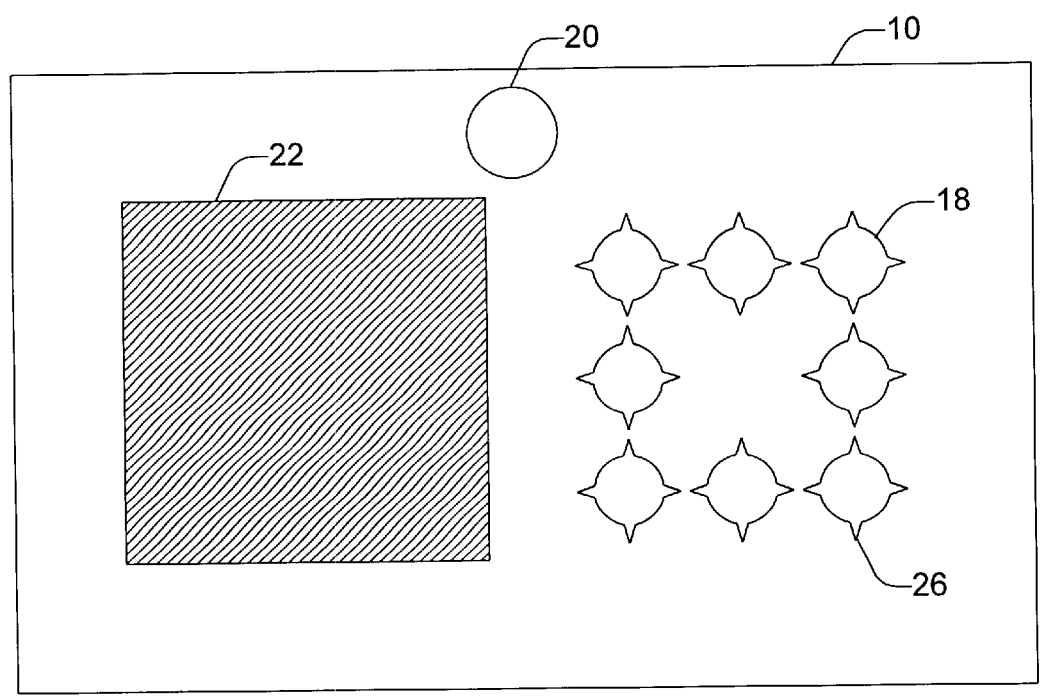
FIG. 1C is a top-plan view of an embodiment of the carrier tape in FIG. 1A wherein relief slits are formed the edges of the receptacle holes.

In the illustrated embodiment of the invention as shown in FIG. 1B, each receptacle hole 18, having a diameter 13, is positioned to receive and clasp onto a single electrical contact 24 which is substantially spherical in shape. Additionally, the diameters 13 of the receptacle holes 18 are sized slightly smaller than a maximum diameter 23 of each electrical contact 24. The chip 22 is secured to the carrier tape 10 by "snap-fitting" each electrical contact 24 into a respective receptacle hole 18. A "snap-fit" is implemented by applying sufficient force to the chip 22 so that the electrical contacts 24 stretch open the receptacle holes 18 so to permit the maximum diameter 23 of the electrical contacts 24 to pass through the thickness of the carrier tape 10. The receptacle hole 18 returns to its initial size after the electrical contacts 24 are fully inserted. In a preferred embodiment, as can be seen in the top-plan view of carrier tape 10 in FIG. 1C, a plurality of relief slits 26 are formed on the edges of receptacle holes 18. Relief slits 26 facilitate "snap-fitting" electrical contacts 24 into respective receptacle holes 18 by relieving surface tension at the edges of the receptacle holes 18 during insertion of electrical contacts 24. As can be appreciated by those of ordinary skill in the art, the number, shape and size of the relief slits formed around each receptacle hole can vary. It can also be appreciated that receptacle holes formed without relief slits can receive and secure electrical contacts in an effective manner.

In another embodiment of the invention, a chip 22 is secured to the carrier tape 10 by inserting each electrical contact 24 into a receptacle hole 18 which has a slightly smaller diameter than the diameter of the electrical contact 24. In contrast to the "snap-fit," in this embodiment of the invention each electrical contact 24 is secured in a receptacle hole through the frictional contact between the edge of receptacle hole and the electrical contact. As can be appreciated by those in the art, a cylindrically-shaped electrical contact can also be inserted and secured by the frictional force applied by the receptacle hole edges.

Figure 2:
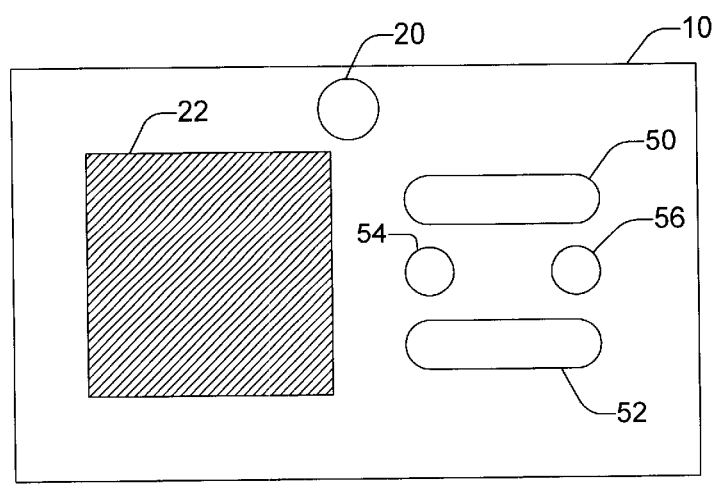
FIG. 2 is a top-plan view of an embodiment of the carrier tape having an alternative pattern of receptacle holes.

FIG. 2 illustrates an embodiment having an alternative pattern of receptacle holes. In this embodiment, receptacle holes 50 and 52 are formed in a parallel fashion and receptacle holes 54 and 56 are formed in between and adjacent to the ends of receptacle holes 50 and 52. Receptacle holes 50 and 52 are each designed to secure multiple electrical contacts of a chip and receptacle holes 54 and 56 are each designed to secure one electrical contact of a chip. As may be appreciated by those of ordinary skill in the art, the receptacle holes may be formed in many various patterns, shapes and sizes and each receptacle-hole may receive and secure one or more electrical contacts. The techniques of "snap-fitting" the electrical contacts of a chip into the receptacle holes may be implemented and relief slits may be used in this embodiment of the invention. To implement "snap-fitting" in receptacle holes 50 and 52, each of these receptacle holes must be sized slightly smaller than the path encircling the respective group of electrical contacts 24, about their maximum diameters, which are to be secured.

Figure 3:
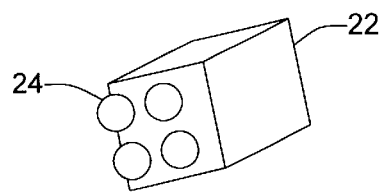
FIG. 3 is a top-plan view of an embodiment of the carrier tape having a single receptacle hole.
Figure 3:
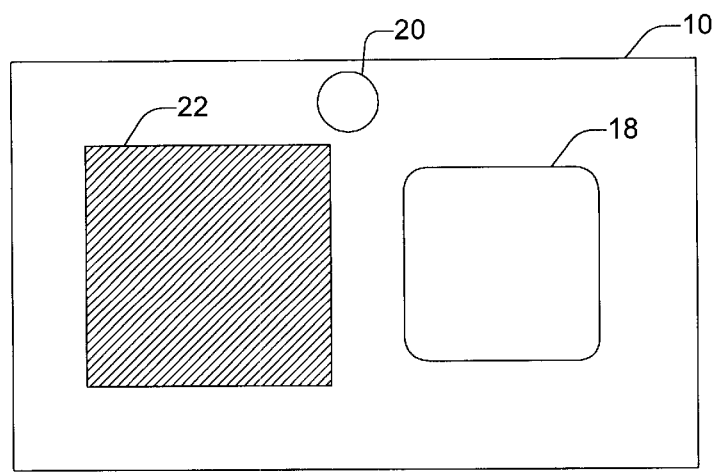

FIG. 3 illustrates another embodiment of an alternative pattern of receptacle holes 18 wherein a single receptacle hole is designed to receive all of the contacts of a chip. The single receptacle hole 18 has a generally rectangular outline wherein the corners are round in shape. The chip is secured through the frictional force created at the points of contact between the electrical contacts and the edges of the receptacle hole. As illustrated in FIG. 3, the receptacle hole 18 may secure an extra-small chip 22 having four electrical contacts 24 formed in a square shaped pattern. In various embodiments, a chip with more or less than four electrical contacts may also be secured by a single receptacle hole 18 so long as the amount of contact between the electrical contacts and the edges of the receptacle hole provide a minimum amount of frictional force to secure and prevent the rotation of the chip within the cavity. As may be appreciated by those of ordinary skill in the art, the outline of the receptacle hole 18 may vary so long as receptacle hole 18 may receive all the electrical contacts of a chip. The techniques of "snap-fitting" the electrical contacts of a chip into the receptacle holes may be implemented and relief slits may be used in this embodiment of the invention.

Figure 4A:
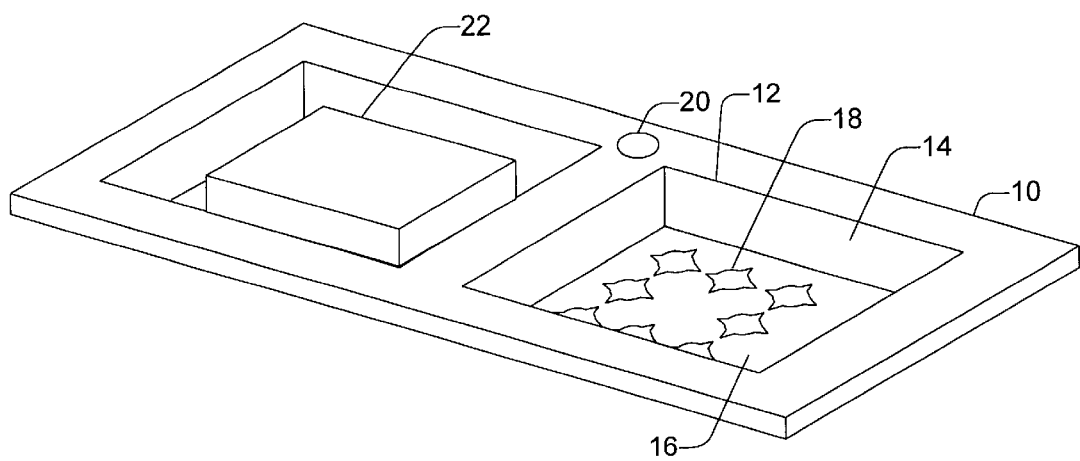
FIG. 4A is a perspective view of an alternative embodiment of the carrier tape wherein the receptacle holes are formed within cavities.

FIG. 4A illustrates a universal carrier tape 10 according to an alternative embodiment of the invention. Carrier tape 10 includes a series of cavities 12 formed in the longitudinal direction along carrier tape 10. Also included on the surface of tape 10 are a series of index holes 20 each associated with a cavity 12. In one embodiment of the invention, each cavity 12 is substantially rectangular and includes four side surfaces 14 and a bottom surface 16. As will be appreciated by those of skill in the art, index holes 20 and cavities 12 may be formed as is known in the art. Formed on the bottom surface 16 of each cavity 12 are one or more receptacle holes 18. Since the receptacle holes 18 receive and clasp the electrical contacts located on the bottom surface of chips 22, the chips 22 are secured within the cavities 12. As may be appreciated, the receptacle holes 18 within the cavities 12 may be formed in a variety of patterns, shapes and sizes, one of which is shown in FIG. 4A for purposes of illustration.

Figure 4B:
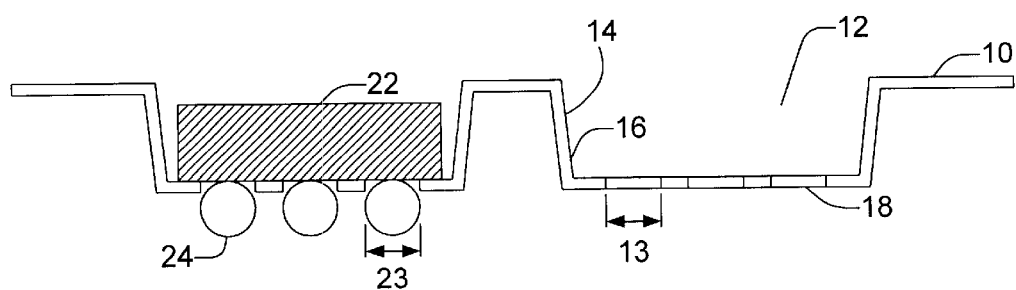
FIG. 4B is a cross-sectional view of the carrier tape in FIG. 4A.
Figure 4C:
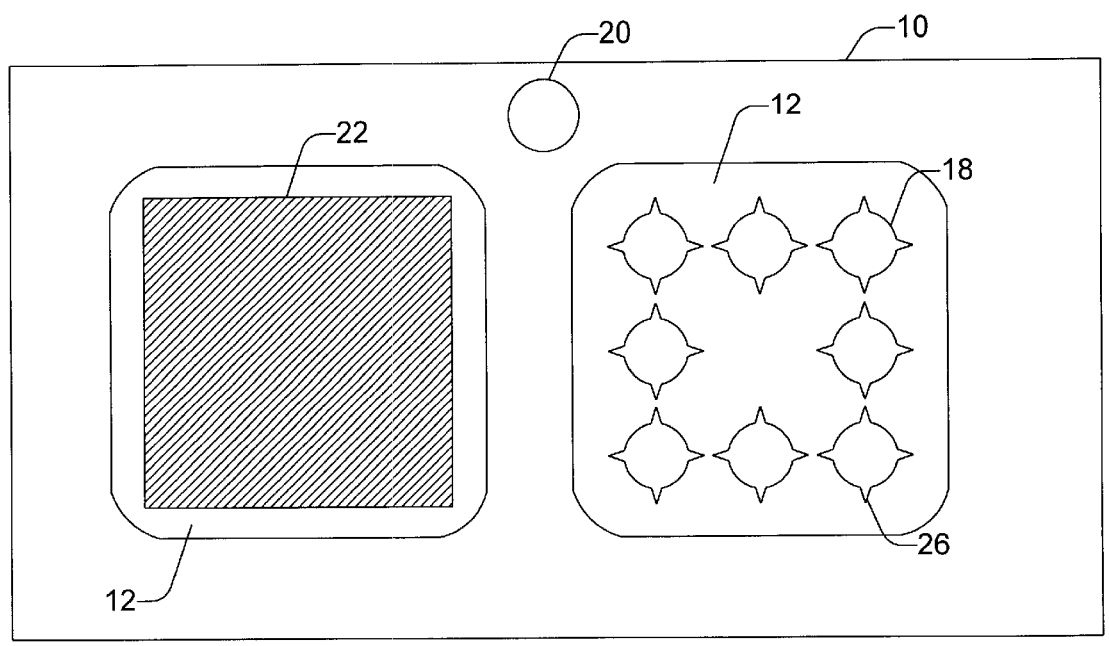
FIG. 4C is a top-plan view of the carrier tape in FIG. 4A.

FIG. 4B shows the cross-sectional view of the carrier tape 10 of FIG. 4A with a chip 22 inserted in a cavity 12. In the illustrated embodiment of the invention as shown in FIG. 4B, each receptacle hole 18, having a diameter 13, is positioned to receive and clasp onto a single electrical contact 24 which is substantially spherical in shape. In this embodiment, as can be seen in the top-plan view of carrier tape 10 in FIG. 4C, a plurality of relief slits 26 are formed on the edges of receptacle holes 18. As can be appreciated by those of ordinary skill in the art, the number, shape and size of the relief slits formed around each receptacle hole can vary. It can also be appreciated that the method of "snap-fitting" the electrical contacts 24 into the receptacle holes 18 may also be utilized in this embodiment of the invention.

Figure 5A:
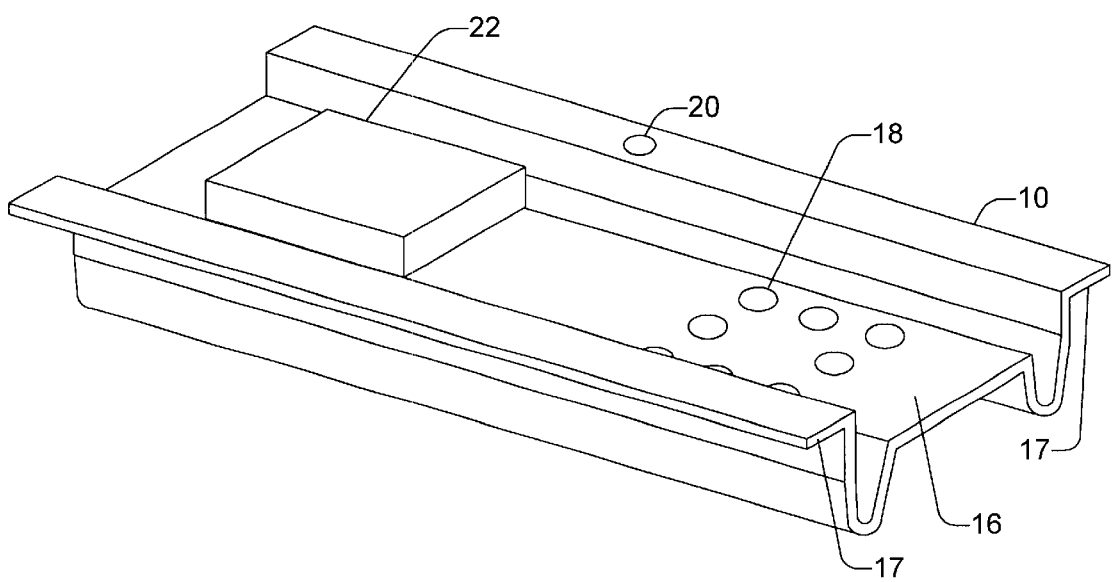
FIG. 5A is a perspective view of an alternative embodiment of the carrier tape wherein a continuous recessed region is formed along the longitudinal axis of the carrier tape.
Figure 5B:
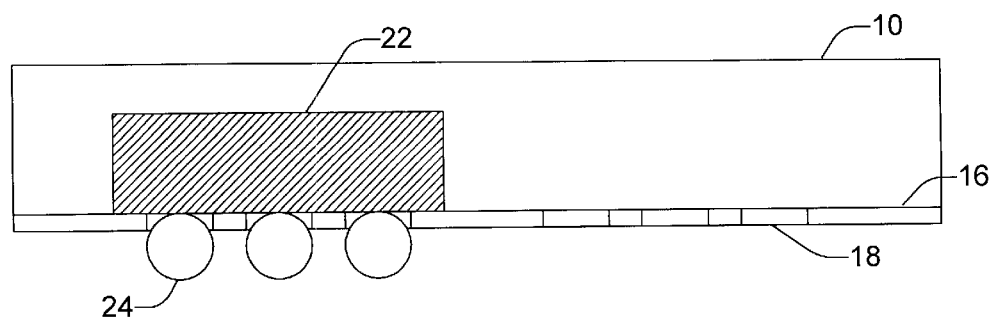
FIG. 5B is cross-sectional view of the carrier tape of FIG. 5A.
Figure 5C:
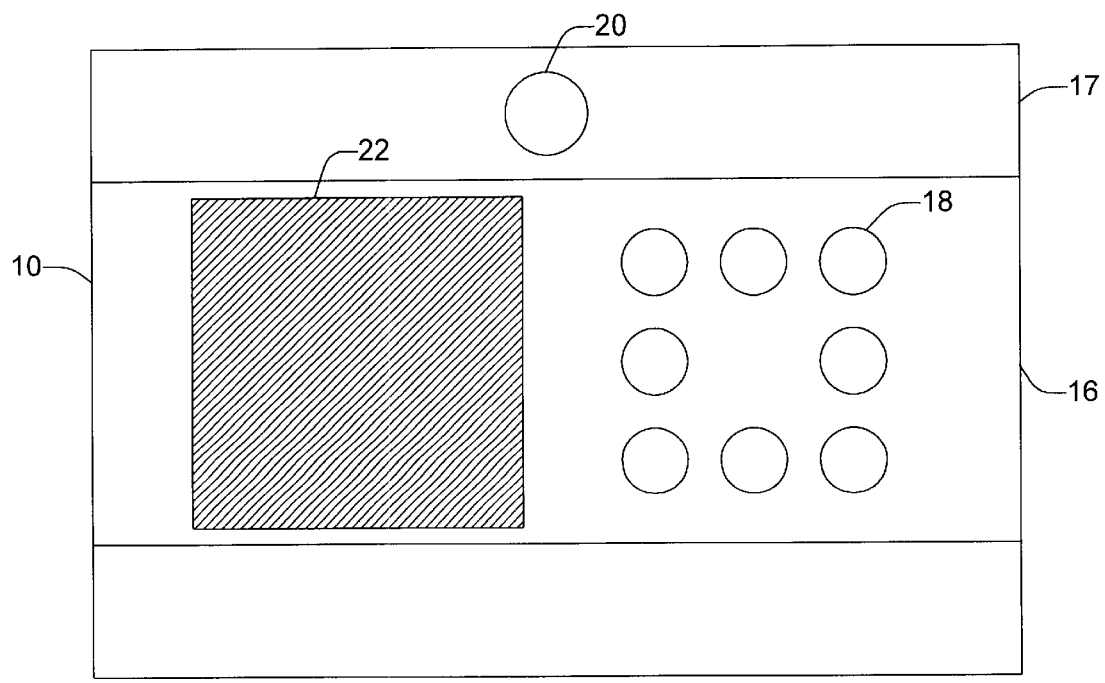
FIG. 5C is a top-plan view of the carrier tape of FIG. 5A.

FIG. 5A illustrates another alternative embodiment of the universal carrier tape 10. In this embodiment, a continuous recessed region is formed along the longitudinal axis of the carrier tape 10. Receptacle holes 18 are formed on the bottom surface 16 of the continuous recessed region. The index holes 20 are formed on one of the two upper flanges 17 of the carrier tape 10. FIG. 5B illustrates the cross-sectional view of the carrier tape 10 of FIG. 5A with a chip 22 secured to the bottom surface 16 of the continuous recessed region. FIG. 5C illustrates the top-plan view of the carrier tape 10 of FIG. 5A. The techniques of "snapfitting" the electrical contacts of a chip into the receptacle holes may be implemented and relief slits may be used in this embodiment of the invention.

Figure 6:
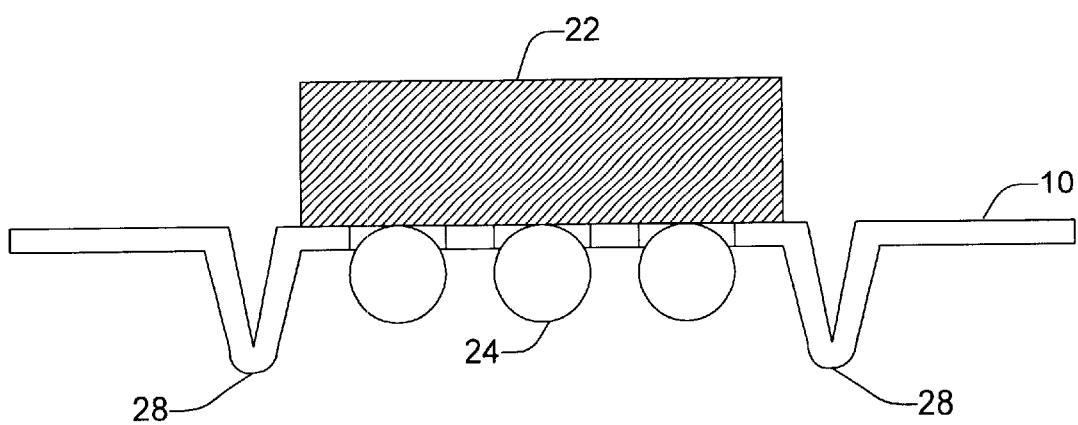
FIG. 6 is a cross-sectional view of an embodiment of the carrier tape in FIG. 1A which includes bottom ridges.

FIG. 6 illustrates a cross-sectional view of an alternative embodiment of the carrier tape 10 of FIG. 1A wherein portions of the carrier tape are extended past the exposed ends of the electrical contacts 24. The extended portions, forming bottom ridges 28, are useful in protecting the electrical contacts 24 from contact with foreign objects. In this manner, the carrier tape 10 can be laid on a flat surface with the electrical contacts 24 remaining free from any physical contact. As can be appreciated by those in the art, the bottom ridges 28 can be formed in a variety of configurations, shapes and sizes. Additionally, the bottom ridges 28 may be formed on a variety of carrier tape 10 embodiments. For example, the bottom ridges 28 may be formed on the bottom surfaces of cavities or continuous recessed regions which may be formed within the carrier tape.

While this invention has been described in terms of several preferred embodiments, there are alterations, permutations and equivalents which fall within the scope of this invention. It should also be noted that there are many alternative ways of implementing the apparatuses of the present invention. For example, the carrier tape 10 can have a width sufficient to contain multiple rows of cavities 12. It is therefore intended that the following appended claims be interpreted as including all such alterations, permutations and equivalents as fall within the true spirit and scope of the present invention.

What is claimed is:

1. A chip carrying system comprising:
   a chip having a plurality of contacts thereon, each of the plurality of contacts having a lengthwise portion that has a non-uniform diameter, each of the lengthwise portions having a section wherein the diameter of the lengthwise portion is at a maximum; and
   a carrier tape having one or more receptacle holes, each of the one or more receptacle holes arranged to grip one or more of the plurality of contacts of the chip, each of the one or more receptacle holes being sized smaller than the maximum diameter of each of the contacts or a path encircling a respective group of contacts, the path traveling about the maximum diameters of the contacts in the group such that each of the one or more receptacle holes snap grip one or more of the plurality of contacts, the carrier tape further having a bottom ridge that extends below a bottom surface of the carrier tape, the depth of the bottom ridge being arranged such that the bottom ridge extends further from the bottom surface of the carrier tape than the plurality of contacts received by the one or more receptacle holes.

2. A chip carrying system as recited in claim 1 wherein each of the one or more receptacle holes has a plurality of relief slits.

3. A chip carrying system as recited in claim 1 wherein the one or more receptacle holes are located within a cavity, the cavity being adapted to receive the chip.

4. A chip carrying system as recited in claim 1 wherein the chip is a flip chip.

5. A chip carrying system as recited in claim 1 wherein each of the plurality of contacts of the chip are ball shaped.

6. A chip carrying system as recited in claim 1 wherein the pitch between adjacent receptacle holes is one selected from the group consisting of approximately 1.0, 0.8, 0.75, 0.5, and 0.4 mm.

7. A chip carrying system as recited in claim 1 wherein a continuous recessed region is formed along a longitudinal axis of the carrier tape wherein the one or more receptacle holes are located within the continuous recessed region.

8. An elongated carrier tape for affirmatively securing semiconductor chips, each of the semiconductor chips having a plurality of contacts thereon, the elongated carrier tape comprising:
   a continuous recessed channel formed along a longitudinal axis of the carrier tape; and
   a plurality of chip securing areas formed on a bottom surface of the recessed channel, each of the chip securing areas adapted to secure a single semiconductor chip and having a plurality of receptacle holes, each of the plurality of receptacle holes arranged to grip a single contact of an associated chip to affirmatively hold the chip, each of the plurality of receptacle holes being sized smaller than a maximum diameter of each of the contacts such that each of the plurality of receptacle holes snap grip each of the plurality of contacts, wherein each of the plurality of receptacle holes has a plurality of relief slits and the pitch between adjacent receptacle holes is approximately 1.0 mm,
   wherein the continuous recessed channel has two bottom ridges that are formed along the longitudinal axis of the carrier tape, each of the bottom ridges extending below the bottom surface of the carrier tape, the depth of the bottom ridge configured such that the bottom ridge extends further from the bottom surface of the carrier tape than each the plurality of contacts received by the receptacle holes, wherein the bottom ridges protect the contacts from structural damage.

9. An elongated carrier tape as recited in claim 8 wherein the elongated carrier tape is configured to affirmatively secure semiconductor chips that are flip chips.

10. An elongated carrier tape as recited in claim 9 wherein the elongated carrier tape affirmatively secures flip chips that have contacts that are ball shaped.

11. An elongated carrier tape for affirmatively securing semiconductor chips, each of the semiconductor chips having a plurality of contacts thereon, the elongated carrier tape comprising:
   a plurality of longitudinally spaced cavities, each of the cavities being adapted to receive a single semiconductor chip, each of the cavities having a plurality of receptacle holes, each of the plurality of receptacle holes arranged to grip a single contact of an associated chip to affirmatively hold the chip within the cavity, each of the plurality of receptacle holes being sized smaller than a maximum diameter of each of the contacts such that each of the plurality of receptacle holes snap grip each of the plurality of contacts, wherein each of the plurality of receptacle holes has a plurality of relief slits, also wherein each of the cavities has a bottom ridge that extends below a bottom surface of each cavity, the depth of the bottom ridge being arranged such that the bottom ridge extends further from the bottom surface of each cavity than the contacts received by the receptacle holes, wherein the bottom ridge protects the contacts from structural damage.

12. An elongated carrier tape as recited in claim 11 wherein the pitch between adjacent receptacle holes is one selected from the group consisting of approximately 1.0, 0.8, 0.75, 0.5, and 0.4 mm.

13. An elongated carrier tape as recited in claim 11 wherein the elongated carrier tape is configured to affirmatively secure semiconductor chips that are flip chips.

14. An elongated carrier tape as recited in claim 13 wherein the elongated carrier tape affirmatively secures flip chips that have contacts that are ball shaped.

* * * * *